(12) United States Patent
Fiolka

(10) Patent No.: US 9,588,435 B2
(45) Date of Patent: Mar. 7, 2017

(54) EUV MICROLITHOGRAPHY PROJECTION EXPOSURE APPARATUS WITH A HEAT LIGHT SOURCE

(71) Applicant: Carl Zeiss SMT GmbH, Oberkochen (DE)

(72) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 407 days.

(21) Appl. No.: 13/783,533

(22) Filed: Mar. 4, 2013

(65) Prior Publication Data

US 2013/0222780 A1 Aug. 29, 2013

Related U.S. Application Data

(63) Continuation of application No. PCT/EP2011/065175, filed on Sep. 2, 2011.
(Continued)

(30) Foreign Application Priority Data

Sep. 24, 2010 (DE) .................. 10 2010 041 298

(51) Int. Cl.
*G03B 27/42* (2006.01)
*G03F 7/20* (2006.01)

(52) U.S. Cl.
CPC ............ *G03F 7/702* (2013.01); *G03F 7/2004* (2013.01); *G03F 7/70158* (2013.01); *G03F 7/70891* (2013.01)

(58) Field of Classification Search
CPC .. G03F 7/702; G03F 7/70075; G03F 7/70258; G03F 7/70191; G03F 7/70033; G03F 7/70558; G03F 1/48
See application file for complete search history.

(56) References Cited

U.S. PATENT DOCUMENTS

| 6,466,382 B2 | 10/2002 | Muller-Rissmann et al. |
| 6,504,597 B2 | 1/2003 | Schuster et al. |

(Continued)

FOREIGN PATENT DOCUMENTS

| EP | 0532236 | 9/1992 |
| EP | 0823662 | 2/1998 |

(Continued)

OTHER PUBLICATIONS

Written Opinion issued Mar. 8, 2012 in PCT Patent Application PCT/EP2011/065175.

*Primary Examiner* — Mesfin Asfaw
(74) *Attorney, Agent, or Firm* — Fish & Richardson P.C.

(57) ABSTRACT

The disclosure relates to an EUV microlithography projection exposure apparatus having an exposure light source for producing radiation in a first spectral range from 5 nm-15 nm, and a heat light source for producing radiation in a second spectral range from 1-50 μm. The apparatus also includes an optical system having a first group of mirrors for guiding radiation from the first spectral range along a light path such that each mirror in the first group can have a first associated intensity distribution applied to it in the first spectral range during operation of the exposure light source. The heat light source is arranged such that at least one mirror in the first group can have a second associated intensity distribution in the second spectral range applied to it during operation of the heat light source. The first intensity distribution differs from the second intensity distribution essentially by a position-independent factor.

24 Claims, 10 Drawing Sheets

Related U.S. Application Data

(60) Provisional application No. 61/386,053, filed on Sep. 24, 2010.

(56) References Cited

U.S. PATENT DOCUMENTS

| | | |
|---|---|---|
| 6,912,077 B2 | 6/2005 | Weiss |
| 2005/0018269 A1* | 1/2005 | Weiss et al. .................. 359/212 |
| 2005/0140947 A1 | 6/2005 | Miyajima |
| 2005/0157284 A1 | 7/2005 | Moors et al. |
| 2007/0260419 A1* | 11/2007 | Hagiwara ........... G03F 7/70358 702/150 |
| 2008/0049202 A1 | 2/2008 | Kraehmer |
| 2008/0158528 A1 | 7/2008 | Stoeldraijer |
| 2010/0051832 A1* | 3/2010 | Nishisaka et al. ........ 250/504 R |
| 2010/0053576 A1 | 3/2010 | Loopstra |

FOREIGN PATENT DOCUMENTS

| | | |
|---|---|---|
| EP | 1670041 | 6/2006 |
| WO | 2009/046895 | 4/2009 |

* cited by examiner

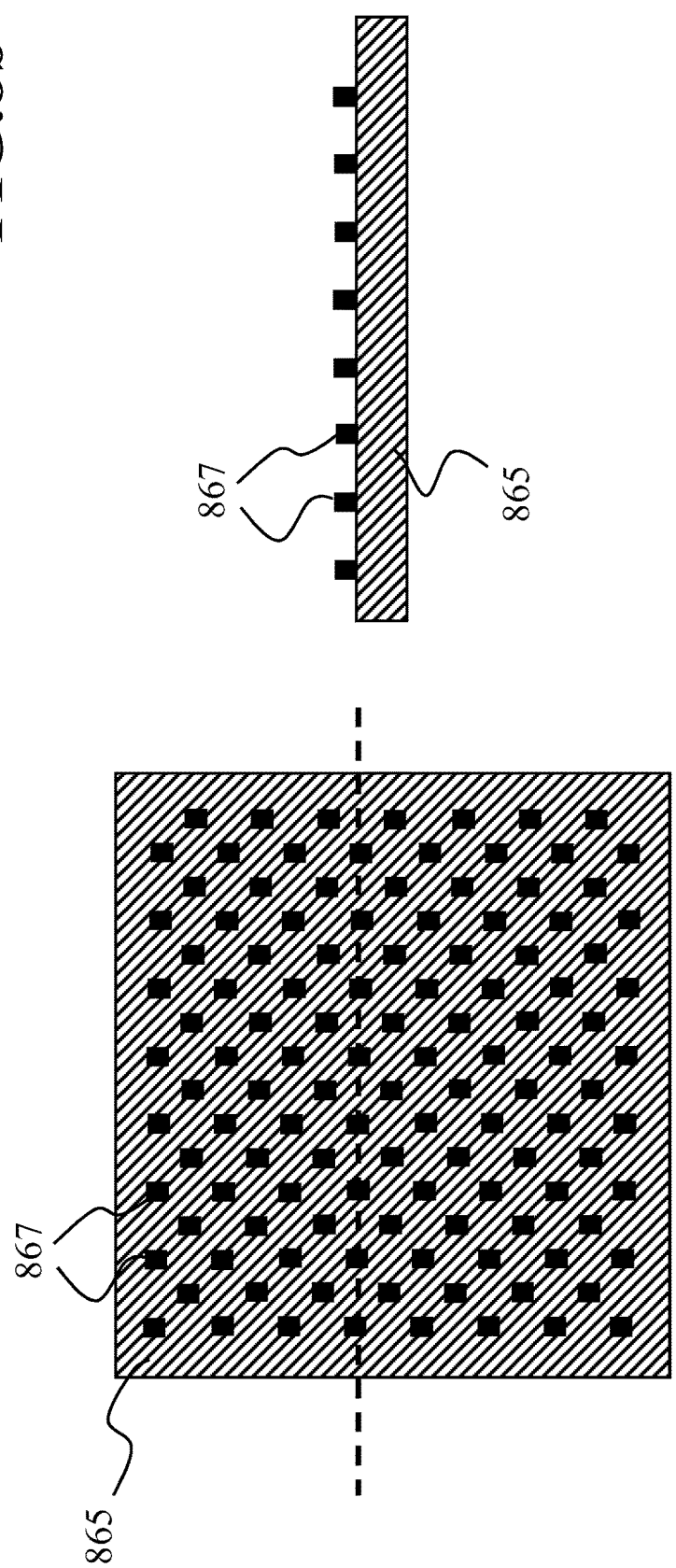

EUV MICROLITHOGRAPHY PROJECTION EXPOSURE APPARATUS WITH A HEAT LIGHT SOURCE

CROSS-REFERENCE TO RELATED APPLICATIONS

This application is a continuation of, and claims priority under 35 U.S.C. §120 to, International Patent Application Serial Number PCT/EP2011/065175, filed Sep. 2, 2011. International Patent Application Serial Number PCT/EP2011/065175 claims priority under 35 U.S.C. §119(e) to U.S. Patent Application Ser. No. 61/386,053, filed Sep. 24, 2010, and also claims benefit under 35 U.S.C. §119 of German Patent Application No. 10 2010 0412898.8, filed on Sep. 24, 2010. The entire disclosure of each of these patent applications is incorporated by reference in the present application.

FIELD

The disclosure relates to an EUV microlithography projection exposure apparatus which includes an exposure light source and a heat light source. The disclosure also relates to a method for operating such a projection exposure apparatus.

BACKGROUND

The use of a heating mechanism within projection exposure apparatuses is known from the publications US2005140947, US2008049202, US2010060988, U.S. Pat. No. 6,912,077, U.S. Pat. No. 6,504,597, U.S. Pat. No. 6,466,382, WO2009046895A1, EP1670041, and EP0823662.

Microlithography projection exposure apparatuses are used to produce microstructured components using a photolithographic method. A structured mask, the so-called reticle is illuminated with the aid of an exposure light source and illumination optics, and is imaged with the aid of projection optics on a substrate having a photosensitive layer. The exposure light source provides radiation which is passed to the illumination optics. The illumination optics is used for uniform illumination, with a predetermined angle-dependent intensity distribution, at the location of the structured mask. Various suitable optical elements are provided within the illumination optics for this purpose. The structured mask which has been illuminated in this way is imaged with the aid of the projection optics onto a photosensitive layer. The minimum structure width which can be imaged with the aid of projection optics such as these is governed, among other things, by the wavelength of the radiation used. In general, the shorter the wavelength of the radiation, the smaller are the structures which can be imaged with the aid of the projection optics. For this reason, an exposure light source is used which produces radiation in a first spectral range from 5 nm to 15 nm. The light within this spectral range is sometimes also called "used light" or "useful light" instead of exposure light. Since there are scarcely any transparent materials for this spectral range, mirrors are used as optical elements.

Microlithography projection exposure apparatuses are frequently operated as so-called scanners. This means that the reticle is moved through an object field in the form of a slot, along a scanning direction during a specific exposure duration, while the wafer is being moved appropriately on the image plane of the projection optics. The ratio of the speeds of the wafer to the reticle corresponds to the magnification of the projection optics between the recticle and the wafer, which is normally less than 1.

During operation of the exposure light source, all the mirrors in the EUV microlithography exposure apparatus have an intensity distribution applied to them in the first spectral range from 5 nm to 15 nm. Each of the mirrors has a first intensity distribution associated with it, which results from its position in the beam path and the specific embodiment of the exposure light source. Because the first intensity distribution associated with the mirrors is applied to the various mirrors, the mirrors are heated during operation of the exposure light source. In order to compensate for this, the mirrors are typically provided with appropriate cooling. Since the first intensity distribution associated with each mirror is constant over time in the first spectral range, this results in an equilibrium state after a specific time $T_1$, in conjunction with the appropriate cooling, in which equilibrium state a first temperature distribution, which is constant over time, is present at each mirror. The temperature rise to the first temperature distribution leads to the optical characteristics of the mirrors changing. For example, the thermal expansion of the mirror substrates leads to a change in the radii of curvature of the mirrors. A change such as this is already taken into account in advance when calculating the optical characteristics of the illumination optics and the projection optics. However, this leads to the optical characteristics of the mirrors being optimal only when the mirrors have already reached their first temperature distribution. After the exposure light source has been switched on, it therefore takes until a time $T_1$ before the optical system, including the exposure light source, illumination optics and projection optics, has reached its optimum state.

SUMMARY

The disclosure provides an EUV projection exposure apparatus which uses a relatively short time to reach its optimum state.

In one aspect of the disclosure, an EUV microlithography projection exposure apparatus includes an exposure light source for producing radiation in a first spectral range from 5 nm-15 nm, and a heat light source for producing radiation in a second spectral range from 1-50 µm. The apparatus also includes an optical system having a first group of mirrors for guiding radiation from the first spectral range along a light path such that each mirror in the first group can have a first associated intensity distribution applied to it in the first spectral range during operation of the exposure light source. The heat light source is arranged such that at least one mirror in the first group can have a second associated intensity distribution in the second spectral range applied to it during operation of the heat light source. The first intensity distribution differs from the second intensity distribution essentially by a position-independent factor. This results in the at least one mirror being preheated by the radiation in the second spectral range before operation of the exposure light source, with the spatial distribution of the heat introduced by the heat light source being essentially identical to the spatial distribution of the heat introduced during operation of the exposure light source. In this case, particularly rapid preheating is achieved if the second intensity distribution is greater than the first intensity distribution by a factor which is greater than 1, preferably greater than 3, particularly preferably greater than 5, and in particular greater than 10.

For the purpose of these applications, first intensity distributions $I1(x,y)$ differ from a second intensity distribution I2(x,y) essentially by a position-independent factor when, for all points (x,y) on the associated mirror surface which lie in an area A, to which radiation is applied during operation of the exposure light source, the following expressions apply:

$$\max_{(x,y)\in A}\left(\frac{I1(x,y)}{I2(x,y)}\right) \leq 1.1 \cdot \frac{\int_A \frac{I1(x,y)}{I2(x,y)} dx dy}{\int_A dx dy}$$

and $$\max_{(x,y)\in A}\left(\frac{I1(x,y)}{I2(x,y)}\right) \geq 0.9 \cdot \frac{\int_A \frac{I1(x,y)}{I2(x,y)} dx dy}{\int_A dx dy}.$$

This means that the point (x, y) with the maximum ratio of I1 and I2 has a ratio of intensities which does not differ upward by more than 10% of the mean ratio of all the points in the area A. Furthermore, the point (x, y) with the minimum ratio of I1 and I2 has a ratio of intensities which differs downward by no more than 10% of the mean ratio of all the points in the area A.

For the purposes of this application, a light path means an organized group of mirrors, with the order corresponding to the sequence in which the radiation passes through the mirrors during operation of the exposure light source. Radiation from its predecessor is reflected on each mirror in the organized group. A first light path is contained completely in a second light path when the organized group associated with the first light path is a subset of the organized group associated with the second light path, and the two organized groups form a light path within the meaning of the above definition. In this case, the second group is also a subset of the first group when the two groups match. These definitions will be explained using a number of examples in conjunction with FIGS. 1a, b, c.

In one embodiment, the EUV microlithography projection exposure apparatus includes an input element, which receives radiation from the heat light source and passes it to the at least one mirror in the first group. This allows more freedom for the choice and position of the heat light source since, for example, it is also possible to use heat light sources with little divergence, with the input element being used to widen the radiation in the second spectral range.

In one embodiment of the disclosure, the mean reflectivity of the at least one mirror for radiation in the second spectral range during operation of the exposure light source differs from the mean reflectivity of the at least one mirror for radiation in the first spectral range during operation of the heat light source by no more than 5%. This results in the radiation from the heat light source in the second spectral range being transformed by the at least one mirror in precisely the same way as the radiation from the exposure light source in the first spectral range. This therefore means that the next mirror has a second associated intensity distribution in the second spectral range applied to it during operation of the heat light source, which differs from the first intensity distribution, which is applied to the next mirror during operation for the exposure light source, essentially by a position-independent factor.

Alternatively or additionally, the microlithography projection exposure apparatus has a second group, including at least two mirrors, which includes the at least one mirror. The second group is a subset of the first group. The heat light source and the input element are arranged such that the radiation from the heat light source is guided along a second light path via all the mirrors in the second group. The second light path is contained completely in the first light path. This results in all the mirrors in the second group being preheated by the same heat light source. The radiation used for preheating in the second spectral range follows the light path of the radiation in the first spectral range between the mirrors in the second group.

In one embodiment, the mean reflectivity of each mirror in the second group for radiation in the second spectral range during operation of the exposure light source differs from the mean reflectivity of the same mirror in the second group for radiation in the first spectral range during operation of the heat light source by no more than 5%. The radiation from the second spectral range is therefore transformed on all the mirrors in the second group in precisely the same way as the radiation from the exposure light source in the first spectral range. This leads to each mirror in the second group having a second associated intensity distribution in the second spectral range applied to it during operation of the heat light source, with the first associated intensity distribution for each mirror in the second group differing from the second associated intensity distribution essentially by a factor which is specific for this mirror.

In one embodiment, the specific factors of all the mirrors in the second group differ by no more than 10%, as a result of which all the mirrors in the second group reach their optimum state essentially at the same time.

In a further refinement of the microlithography projection exposure apparatus, the exposure light source includes a laser for producing a plasma, and the laser is also the heat light source. This means that there is no need to add an additional heat light source, and an already existing component can instead be used as a heat light source.

In this embodiment, the exposure light source includes material droplets which are excited to a plasma state by the radiation of the laser during operation of the exposure light source. The material droplets are used as an input element during operation of the laser as a heat light source, in that they reflect the radiation of the laser.

In contrast, in some embodiments, the input element is in the form of a diffractive optical element for producing the second intensity distribution on the at least one mirror. Particularly good intensity distributions on a downstream plane in the light path can be achieved with the aid of a diffractive optical element by choosing the structures of the diffractive optical element such that a suitable angular distribution of the radiation is obtained by diffraction.

The disclosure also relates to a method for operating a microlithography projection exposure apparatus. The method includes preheating the at least one mirror over a time period $T_1$ by irradiation with radiation from the second spectral range, thus producing a second temperature distribution on the at least one mirror, and using the optical system to expose a photosensitive substrate to radiation from the first spectral range. This method has the advantage that at least one mirror has already been preheated, and is therefore close to its optimum state, at the start of the exposure process.

In one embodiment, during the preheating, an infrared absorber, in particular including heat-resistant glass or ceran or some other ceramic, is fitted in front of the at least one mirror, in order to increase the absorption of the radiation from the second spectral range. This allows a wide range of heat light sources with different wavelengths in the second spectral range to be used. Since the reflectivity of the mirrors is very high at some wavelengths, the mirrors are heated only slowly. For this reason, an infrared absorber is used, composed of a material which has high absorption for radiation at this wavelength, thus resulting in rapid heating and in the heat being emitted to the mirror which is arranged adjacent. Heat-resistant glass or ceran or some other ceramic have the additional advantage that they have low thermal conductivity, as a result of which the temperature distribution on the infrared absorber corresponds to the intensity distribution of the incident radiation in the second spectral range.

In one specific further embodiment, the first temperature distribution differs from a second temperature distribution, which is present at the at least one mirror during the exposure step because of absorption of the radiation from the first spectral range, by no more than 1 Kelvin at a point on the at least one mirror. The preheating therefore results in the at least one mirror reaching a temperature distribution which does not differ significantly from the temperature distribution which results with the equilibrium state during operation of the exposure light source. Therefore, the mirror differs to a particularly little extent from its optimum state at the start of the exposure step.

The disclosure also relates to a method for operating a microlithography projection exposure apparatus in which the exposure light source includes a laser for producing a plasma, wherein the laser is also the heat light source at the same time. The method includes introducing an input element, operating the laser as a heat light source, removing the input element, and operating the laser as a component of the exposure light source. This method makes it possible to avoid using an additional heat light source, since an already existing component in the form of the laser is used as a heat light source.

BRIEF DESCRIPTION OF THE DRAWINGS

The disclosure will be explained in more detail with reference to the drawings.

FIG. 3b shows the ratio of the intensity distributions illustrated in FIG. 3a.

FIG. 8b shows a view of and a section through an infrared absorber.

DETAILED DESCRIPTION

The reference signs have been chosen such that objects which are illustrated in FIG. 1 have been provided with single-digit or two-digit numbers. The objects illustrated in the further figures have reference signs which have three or more digits, with the last two digits indicating the object and the preceding digit indicating the number of the figure in which the object is illustrated. Therefore, the last two digits of the reference digits for the same objects which are illustrated in a number of figures match. The description relating to these objects may be included in the text relating to a preceding figure.

Figure 1A:
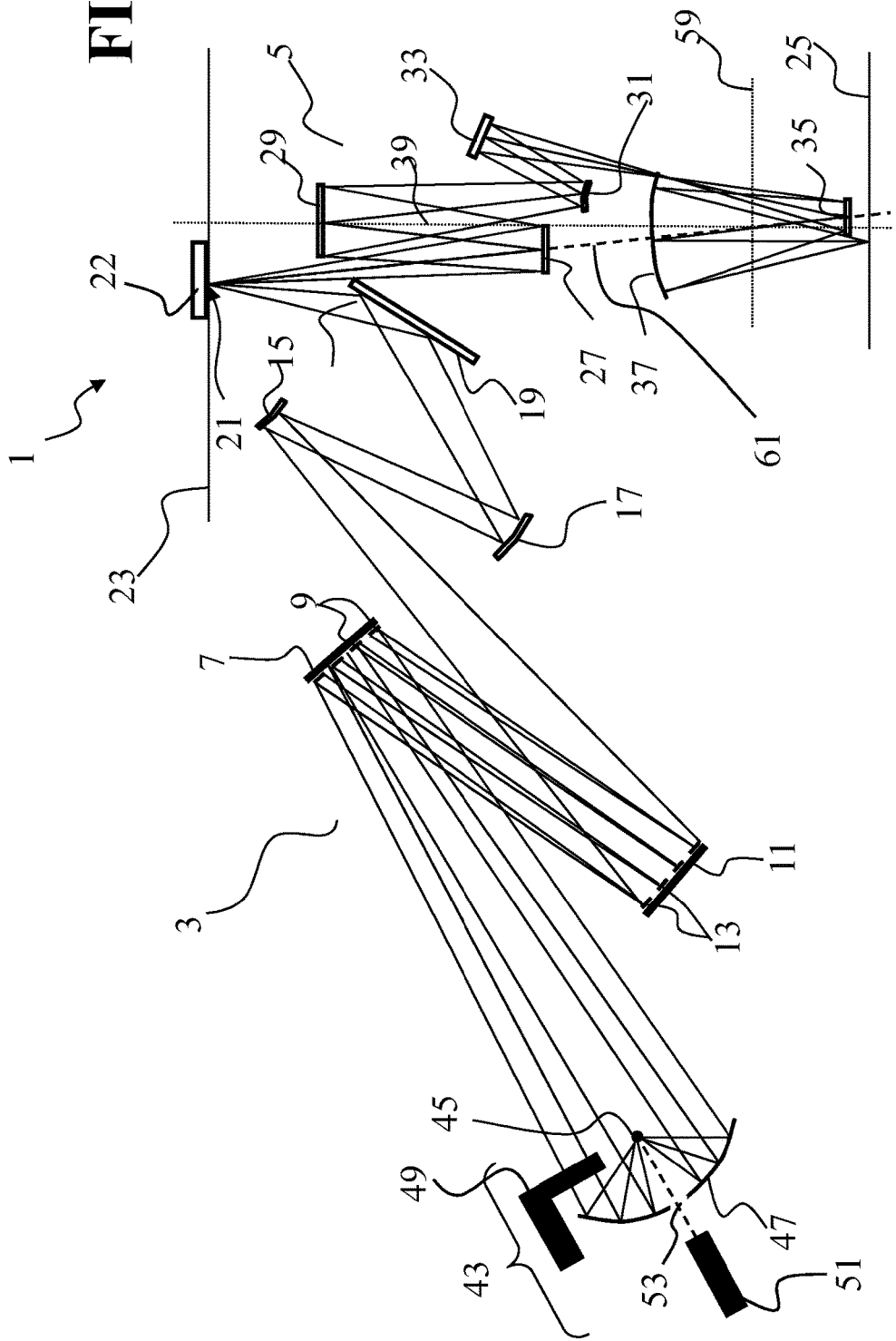
FIG. 1a shows a projection exposure apparatus according to the disclosure during operation of the exposure light source.

FIG. 1a shows a refinement of an EUV microlithography projection exposure apparatus 1 according to the disclosure with illumination optics 3 and projection optics 5. In this case, the illumination optics 3 include a first optical element 7 with a plurality of first reflective facet elements 9 and a second optical element 11 with a plurality of second reflective facet elements 13. The illumination optics 3 furthermore include a first telescope mirror 15 and a second telescope mirror 17, which are arranged such that they are both operated with vertical incidence, that is to say the radiation strikes both mirrors at an incidence angle between 0° and 45°. In this case, the incidence angle means the angle between the incident radiation and the normal to the reflective optical surface. A deflection mirror 19 is arranged next in the beam path and deflects the radiation which strikes it onto the object field 21 on the object plane 23. The reflective reticle 22 is in this case arranged at that point in the object field. The deflection mirror 19 is operated with grazing incidence, that is to say the radiation strikes the mirror at an incidence angle between 45° and 90°. A reflective structured mask, the so-called reticle, is arranged at that point in the object field 21, and is imaged on the object plane 25 with the aid of the projection optics 5. A light-sensitive substrate with a photosensitive layer which is exposed by the imaging is located on the image plane. The projection optics 5 includes six mirrors 27, 29, 31, 33, 35 and 37. All six mirrors in the projection optics 5 each have a reflective optical surface which runs along a surface which is rotationally symmetrical about the optical axis 39.

Figure 1B:
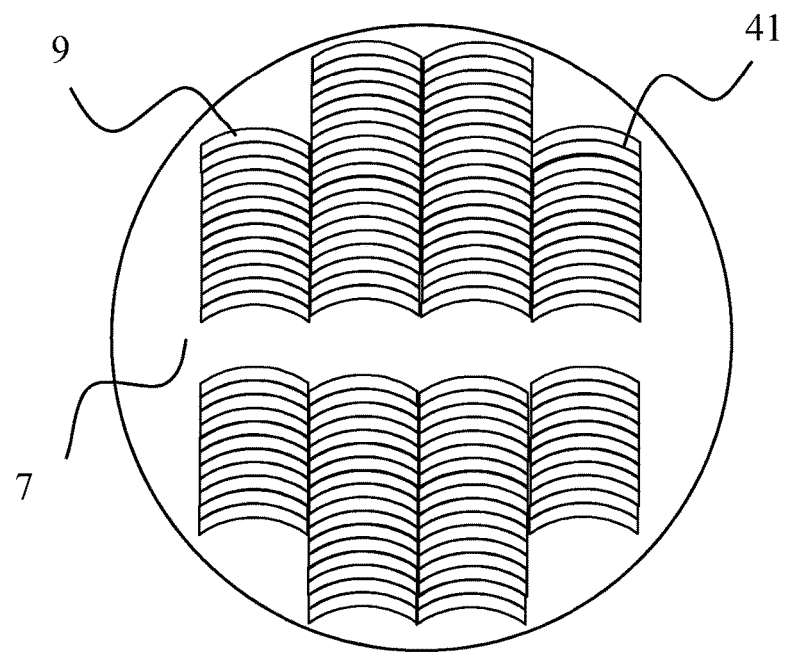
FIG. 1b shows a plan view of the first optical element of the illumination optics.

FIG. 1b shows a view of the first optical element 7, which includes a plurality of first reflective facet elements 9. Each of the first reflective facet elements 9 has a reflective surface for reflection of the incident radiation.

Figure 1C:
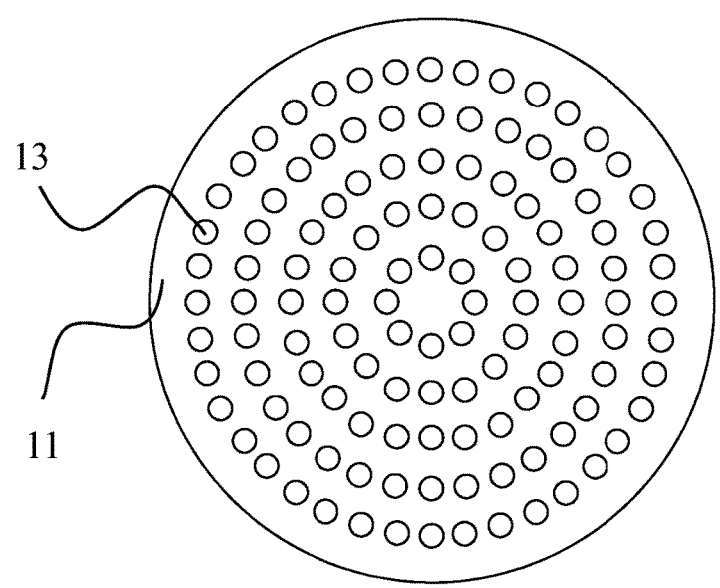
FIG. 1c shows a view of the second optical element of the illumination optics.

FIG. 1c shows a corresponding view of the second optical element 11, with a plurality of second reflective facet elements 13.

The projection exposure apparatus shown in FIG. 1a furthermore includes an exposure light source 43, for producing radiation in a first spectral range from 5 nm to 15 nm, which passes radiation to the first optical element 7. The exposure light source 43 in this case includes a source plasma 45 and a collector mirror 47. The exposure light source 43 may be configured in various forms. The illustration shows a laser plasma source (LPP). This source type produces a tightly bounded source plasma 45, by producing a small material droplet from, for example, tin using a droplet generator 49, which is applied to a predetermined point. There, the material droplet is irradiated with a high-energy laser 51, as a result of which the material is changed to a plasma state and emits radiation in the wavelength range from 5 to 15 nm. In this case, the laser 51 can be arranged such that the laser radiation passes through an opening 53 in the collector mirror before striking the material droplet. By way of example, a $CO_2$ laser with a wavelength of 10.6 μm is, that is to say, in the infrared range, is used as the laser 51. Alternatively, the exposure light source 43 may also be in the form of a discharge source, in which the source plasma 45 is produced via a discharge. The collector mirror 49 and the first reflective facet elements 9 have an optical effect such that images of the source plasma 45 are produced at the points of the second reflective elements 13 of the second optical element 11. For this purpose, on the one hand, the focal lengths of the collector mirror 49 and of the first facet elements 9 are chosen to correspond to the spatial distances. This is done, for example, by providing suitable curvatures in the reflective optical surfaces of the first reflective facet elements 9. On the other hand, the first reflective facet elements 9 have a reflective optical surface with a normal vector whose direction defines the orientation of the reflective optical surface in space, with the normal vectors of the reflected surfaces of the first facet elements 9 being oriented such that the radiation reflected by a first facet element 9 strikes an associated second reflective facet element 13. The second optical element 11 is arranged on a pupil plane of the illumination optics 3, which is imaged on the outlet pupil plane with the aid of the mirrors 15, 17 and 19. In this case, the outlet pupil plane of the illumination optics 3 actually corresponds with the inlet pupil plane 59 of the projection optics 5. The second optical element 11 therefore lies on a plane which is the optical conjugate of the inlet pupil plane 59 of the projection optics 5. For this reason, there is a simple relationship between the intensity distribution of the radiation on the second optical element 11 and the angle-dependent intensity distribution of the radiation in the area of the object field 21. In this case, the inlet pupil plane of the projection optics 5 is defined as the plane at right angles to the optical axis 39 on which the chief ray 61 intersects the optical axis 39 at the center point of the object field 21.

The object of the second facet elements 13 and of the downstream optical system, which includes the mirrors 15, 17 and 19, is to image the first facet elements 9 superimposed in the object field 21. In this case, a superimposed imaging mechanism that images of the first reflective facet elements 9 are created on the object plane, and at least partially overlap there. For this purpose, the second reflective facet elements 13 have a reflective optical surface with a normal vector whose direction defines the orientation of the reflective optical surface in space. For each second facet element 13, the direction of the normal vector is chosen such that the associated first facet element 9 is imaged in the object field 21 on the object plane 23. Since the first facet elements 9 are imaged in the object field 21, the shape of the illuminated object fields 21 corresponds to the external shape of the first facet elements 9. The external shape of the first facet elements 9 is therefore normally chosen to have a curved shape such that the long boundary lines of the illuminated object field 21 run essentially in the form of a circular arc around the optical axis 39 of the projection optics 5.

The mirrors 47, 7, 11, 15, 17, 19, 22, 27, 29, 31, 33, 35 and 37 form a group of mirrors for guiding radiation from the first spectral range along a light path. In this case, the reflective reticle 22 is likewise understood to be a mirror. For the purposes of this application, a light path means an organized group of mirrors, with the order corresponding to the sequence in which radiation passes through the mirrors during operation of the exposure light source. In this case, in addition, radiation from its predecessor in the group is reflected on each mirror in the organized group. The organized group 47, 7, 11, 15, 17, 19, 22, 27, 29, 31, 33, 35, 37 is therefore a first light path. The organized group 7, 11, 15 is likewise a second light path, since the radiation passes through the mirrors 7, 11 and 15 successively. In this case, the second light path is contained completely in the first light path, since the group of mirrors 7, 11 and 15 is a subset of the mirror group 47, 7, 11, 15, 17, 19, 22, 27, 29, 31, 33, 35, 37. The organized group 11, 7, 15 is in contrast not a light path, since the sequence does not correspond to the correct propagation path of the radiation during operation of the exposure light source 43. The organized group 27, 29, 33 is likewise not a light path, since radiation on the mirror 33 is not reflected by the mirror 29, which is its predecessor within the group, but by the mirror 31.

During operation of the exposure light source 43, all the mirrors (47, 7, 11, 15, 17, 19, 22, 27, 29, 31, 33, 35, 37) of the EUV microlithography projection exposure apparatus have an intensity distribution in the first spectral range from 5 nm to 15 nm applied to them. In this case, each of the mirrors has a first intensity distribution associated with it, which results from its position in the beam path and from the form of the exposure light source 43. The first intensity distribution, which is associated with the collector mirror 47, results, for example, from the distance between the collector mirror 47 and the source plasma 45, and the curvature of the collector mirror 47 as well as the emission characteristic of the source plasma 45 in the first spectral range. Because the first intensity distribution which is associated with them is applied to the various mirrors, the mirrors are heating during operation of the exposure light source 43. In order to compensate for this, the mirrors are provided with appropriate cooling. In this case, for example, this may be active cooling such as liquid cooling or else passive cooling by heat sinks for radiated heat emission. Since the first intensity distribution, which is associated with each mirror, in the first spectral range is constant over time, this results in an equilibrium state in conjunction with the appropriate cooling after a specific time $T_1$, in which equilibrium state a first temperature distribution which is constant over time is present on each mirror. The temperature rise to the first temperature distribution leads to the optical characteristics of the mirrors changing. For example, the thermal expansion of the mirror substrates leads to a change in the radii of curvature of the mirrors. A change such as this is already taken into account in advance in the calculation of the optical characteristics of the illumination optics and of the projection optics. However, this leads to the optical characteristics of the projection optics and illumination optics being optimum only when the mirrors have already reached their first temperature distribution. After the exposure light source has been switched on, it therefore takes up to a time $T_1$ before the optical system including the illumination optics and the projection optics has reached its optimum state. For this reason, the disclosure provides for the mirrors to be preheated with the aid of a heat light source.

Figure 2:
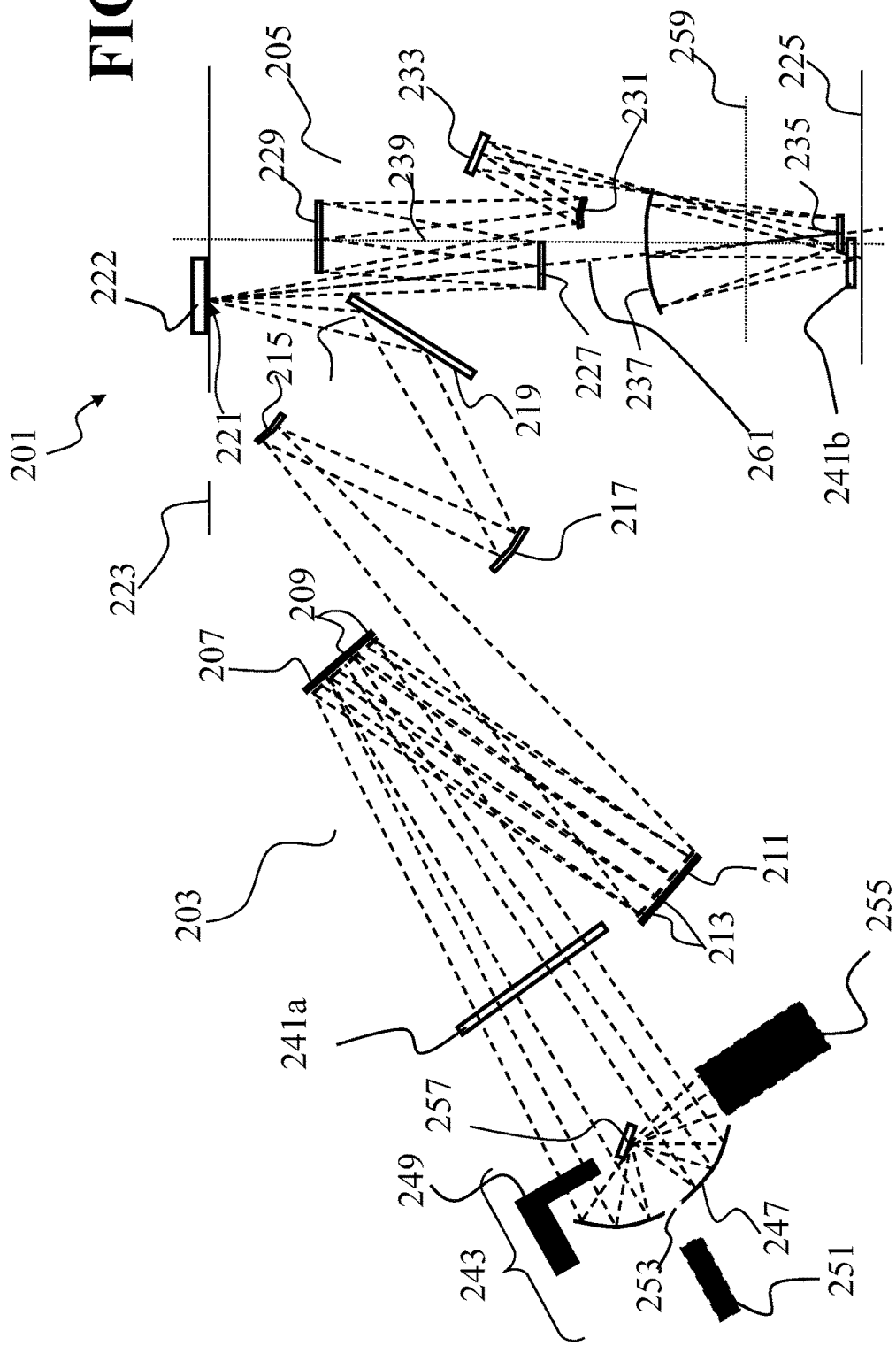
FIG. 2 shows a projection exposure apparatus according to the disclosure during operation of the heat light source.

FIG. 2 shows a first refinement of this heat light source according to the disclosure. In this embodiment, the heat light source 255 is in the form of an infrared light source with a wavelength of 1.2 μm. The radiation emitted from the heat light source 255 in the second spectral range strikes an input element 257 which is arranged close to the source plasma location. In this case, the input element 257 is in the form of a reflective grating, with the grating struts being arranged such that the diffraction of the infrared radiation at the wavelength of 1.2 μm results in an angular distribution of the radiation downstream from the grating, as a result of which a second associated intensity distribution in the second spectral range is applied to the collector mirror 247. In this case, the second associated intensity distribution of the collector mirror differs from the first associated first intensity distribution of the collector mirror essentially by a position-independent factor. This means that the collector mirror 247 is heated such that a second temperature distribution is present after a time period $T_2$ on the collector mirror 247, as if the exposure light source 251 had been operated until a time $T_1$, that is to say the second temperature distribution differs from the first temperature distribution by no more than 1 Kelvin at a point on the mirror. In this case, the intensity of the heat light source 255 is chosen to be sufficiently high that the time period $T_2$ is less than the time period $T_1$. The collector mirror 247 therefore assumes its predetermined optimum state more quickly.

It is particularly advantageous for the mean reflectivity of the mirrors for radiation in the second spectral range to differ from the mean reflectivity of the mirrors in the first spectral range by no more than 5%. In the present case, the collector mirror 247 has a multilayer coating composed of layers of molybdenum and silicon with a covering layer composed of ruthenium. This results in a good reflectivity of about 67% for radiation at the wavelength of 13.5 nm. At the same time, the wavelength of the heat light source is chosen to be 1.2 µm, such that the reflectivity of the collector mirror 247 for radiation at the wavelength 1.2 µm is in the range from 62% to 72%, that is to say it differs by no more than 5%. This results in the radiation from the heat light source in the second spectral range being transformed by the collector mirror 247 in precisely the same way as the radiation from the exposure light source in the first spectral range. This therefore means that the first optical element 207 has a second associated intensity distribution in the second spectral range applied to it during operation of the heat light source, which differs from the first intensity distribution, which is applied to the first optical element during operation of the exposure light source, essentially by a position-independent factor. A corresponding situation also applies to the coating on the further mirrors, as a result of which a second associated intensity distribution, which differs from the first associated intensity distribution in the first spectral range essentially by a position-independent factor, is also present on the second optical element 211, the first and second telescope mirrors 215 and 217 and on the folding mirror 219 during operation of the heat light source. The folding mirror 219 is provided with a purely metallic coating composed of ruthenium, since it is operated with grazing incidence. This coating also results in the reflectivity from radiation at the wavelength of 13.5 nm being essentially the same as the reflectivity for radiation at the wavelength 1.2 µm. A structured mask, the so-called reticle 222, is located at the point on the object field 221 during operation of the EUV microlithography projection exposure apparatus. This mask is imaged on the object plane 225 by the projection optics 205. In this case the EUV radiation which strikes the mask is diffracted on the structures of the mask such that the intensity distributions which are applied to the mirrors in the projection optics (227, 229, 231, 233, 235, 237) are dependent on the precise form of the mask. Therefore, during operation of the heat light source 255, a heat mask is therefore used at the point in the object field 221, causing corresponding diffraction of the radiation in the second spectral range. For this purpose, the heat mask has structures which correspond to those of the EUV mask with the difference that the structures of the heat mask are greater corresponding to the ratio of the wavelengths, that is to say by the factor 1.2 µm divided by 13.5 nm. This results in an intensity distribution in the second spectral range, which differs from the intensity distribution on the respective mirror in the first spectral range essentially by a position-independent factor during operation of the exposure light source, also being present on the first objective mirror 227 and on the objective mirrors which then follow this during operation of the heat light source.

In an optional variant, which is likewise illustrated in FIG. 2, the EUV microlithography projection exposure apparatus has a first polarizer 241a and a second polarizer 241b. The two polarizers are wire grating polarizers having a grating period for polarization of the radiation in the second spectral range. In the present case of the heat light source which emits radiation at a wavelength of 1.2 µm, the grating period is therefore 0.6 µm. The radiation in the second spectral range is linearly polarized by the first polarizer 241. The input radiation in the second ray range is completely absorbed with the aid of the second polarizer 241b, which is arranged rotated through 90° with respect to the polarization direction of the radiation at the point of the second polarizer.

This means that the radiation in the second spectral range does not reach the substrate with the photosensitive layer on the image plane 225. It is therefore possible to operate the exposure light source and the heat light source at the same time without the radiation in the second spectral range causing undesired exposure of the substrate with the photosensitive layer on the image plane 225. The heat source can therefore be operated first of all, in order to preheat the mirrors. Both the heat light source and the exposure light source can then be operated in a second step. In this operating state, structured masks can already be imaged using the radiation in the first spectral range. However, since the mirrors have not yet reached their first temperature distribution, this imaging takes place with reduced quality. As soon as the irradiation results in the mirrors assuming the one temperature distribution, which differs from the first temperature distribution by no more than 1 Kelvin at the point on the mirror, the heat light source can be switched off. The polarizers 241a and 241b may then be removed from the beam path. Instead of switching off the heat light source with a delay, the intensity of the heat light source can also be reduced successively.

Figure 3A:
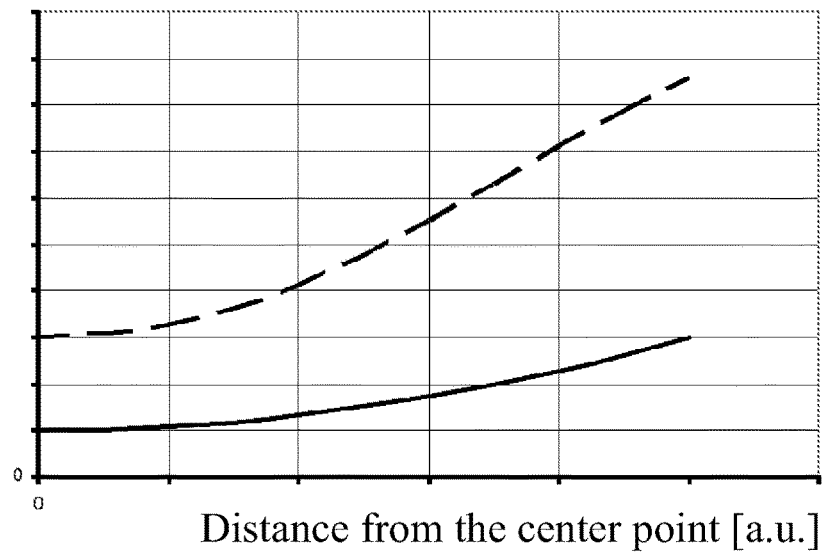
FIG. 3a shows a first and a second associated intensity distribution.
Figure 3B:
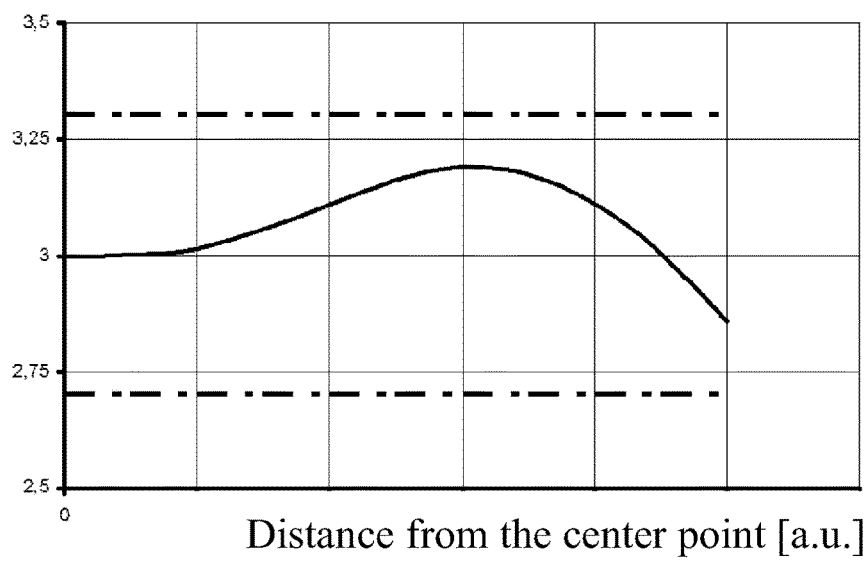

A solid line in FIG. 3a schematically illustrates a first associated intensity distribution on the collector mirror 47 from FIG. 1. Since this intensity distribution is rotationally symmetrical about the center point, the intensity is shown only as a function of the distance from the center point. In general, the intensity distribution of a mirror is a function of two independent variables (x, y), which characterize the point on the mirror surface. A dashed line represents the second intensity distribution associated with the collector mirror, which is applied to the collector mirror during operation of the heat light source. FIG. 3b shows that the first and the second intensity distributions differ essentially by a position-independent factor. For this purpose, the ratio of the second intensity distribution to the first intensity distribution is represented as a function of the distance from the center point. The ratio varies over the collector mirror by not more than 10% of the factor. In the present case, the ratio at any point on the collector mirror is between 2.7 and 3.3.

Figure 4:
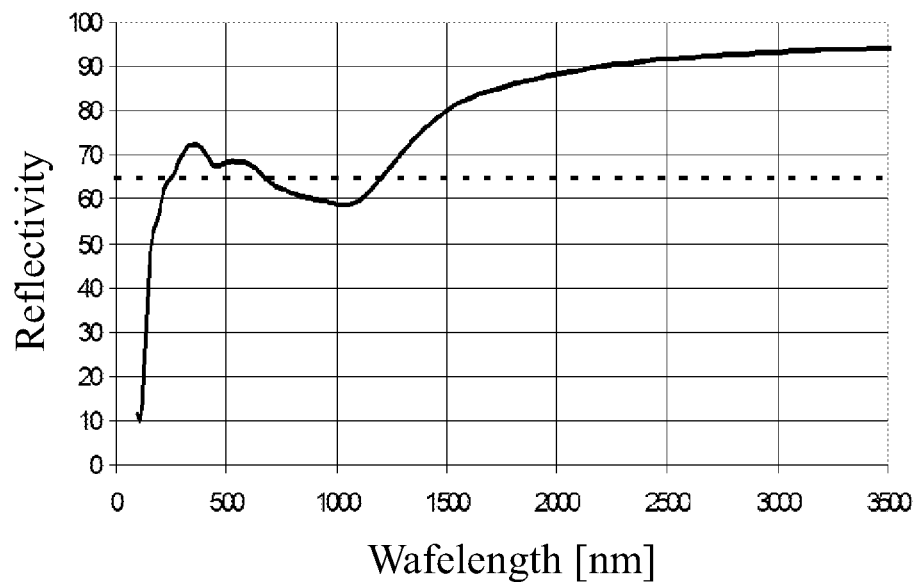
FIG. 4 shows the reflectivity of a Mo/Si layer stack with a ruthenium covering layer as a function of the incident wavelength.
Figure 4:
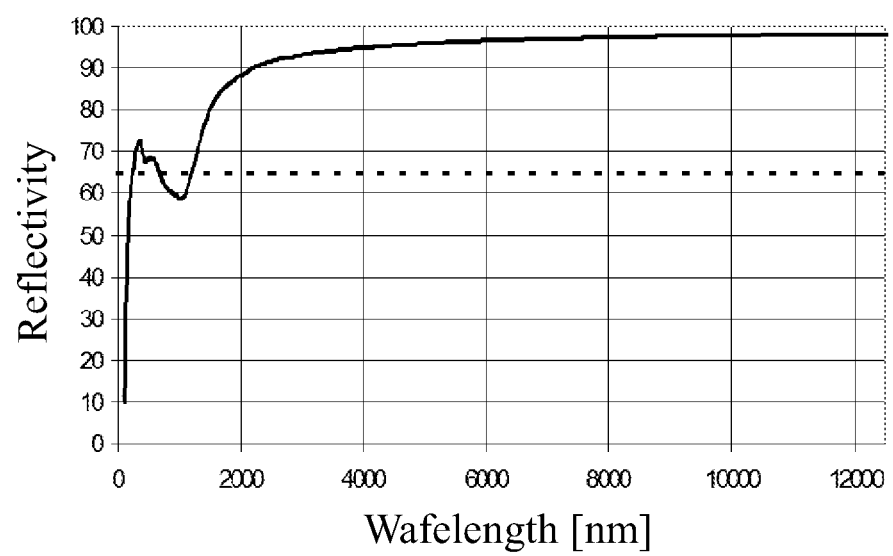

The solid curve in FIG. 4, by way of example, shows the reflectivity of an Mo/Si layer stack having a ruthenium covering layer as a function of the incident wavelength. The upper figure shows the range from 100 nm to 3500 nm, and the lower figure shows the range from 100 nm to 12500 nm. Furthermore, the reflectivity of 65% is marked by a dashed line. Typical layer stacks of molybdenum and silicon having a ruthenium covering layer have a reflectivity of about 65% for radiation at the wavelength of 13.5 nm. The reflectivity first of all decreases at longer wavelengths. The reflectivity of the example illustrated in FIG. 4 for 100 nm is about 10%. At even longer wavelengths, the reflectivity of the layer stack such as this is governed primarily by the metallic layers. This therefore results in very good reflectivity for wavelengths of more than 50 µm. For this reason, the reflectivity curve intersects the 65% mark at least once, as a result of which there is at least one wavelength in the range from 100 nm to 50 µm at which the reflectivity is likewise 65%. In the present case, this is the wavelength of 1.2 µm. Depending on the precise layer system, this wavelength may vary, and is therefore determined as appropriate by theoretical calculations or experimentally. This allows at least one wavelength to be determined at which the mean reflectivity in the second spectral range differs from the mean reflectivity of the mirror in the first spectral range by no more than 5% points.

Figure 5:
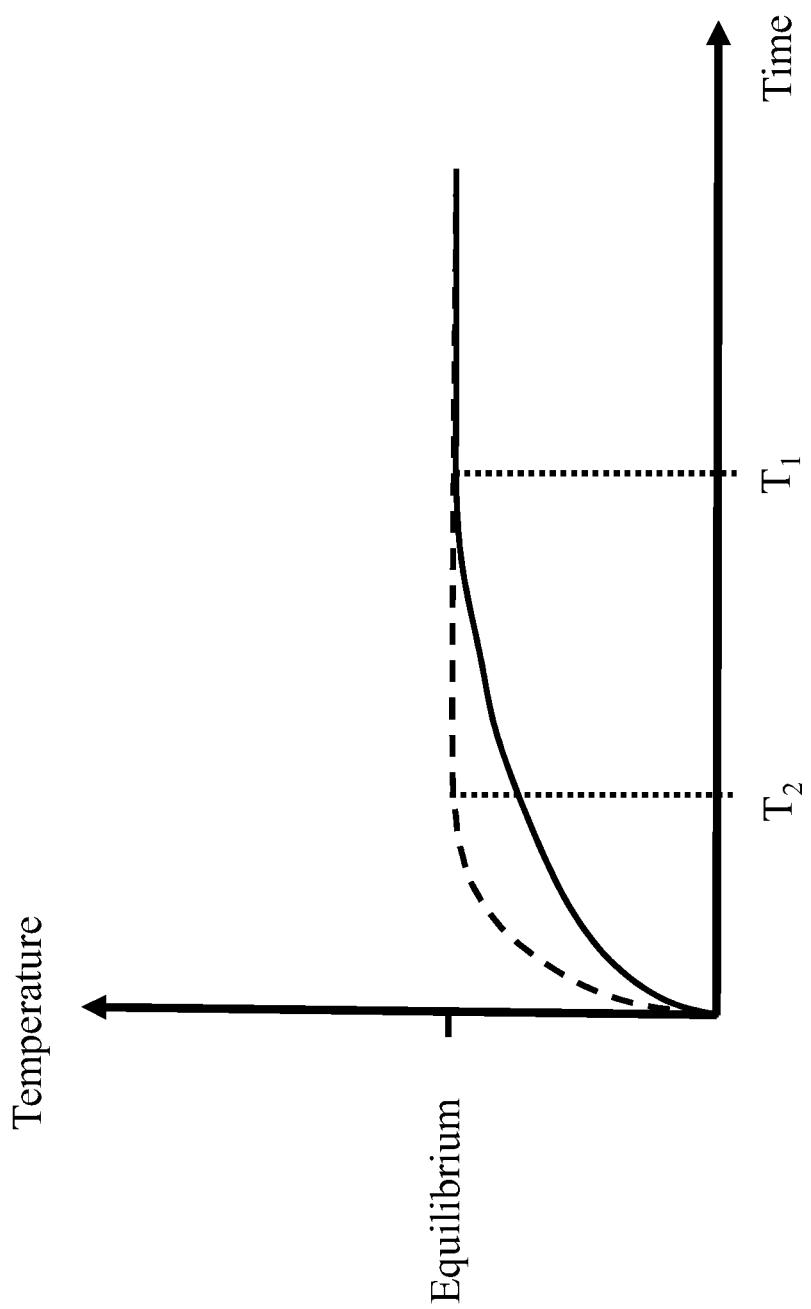
FIG. 5 shows, schematically, the temperature development at one point on a mirror up to an equilibrium temperature.

FIG. 5 schematically shows the temperature development at one point on a mirror toward an equilibrium temperature. While it takes a time $T_1$ during operation of the exposure light source (solid line) for the mirror to reach its equilibrium temperature at this point, the operation of the heat light source (dashed line) means that the temperature is already reached after a time $T_2$. The mirror is therefore already at its optimum state at the time $T_2$, thus allowing the exposure to be started.

Figure 6:
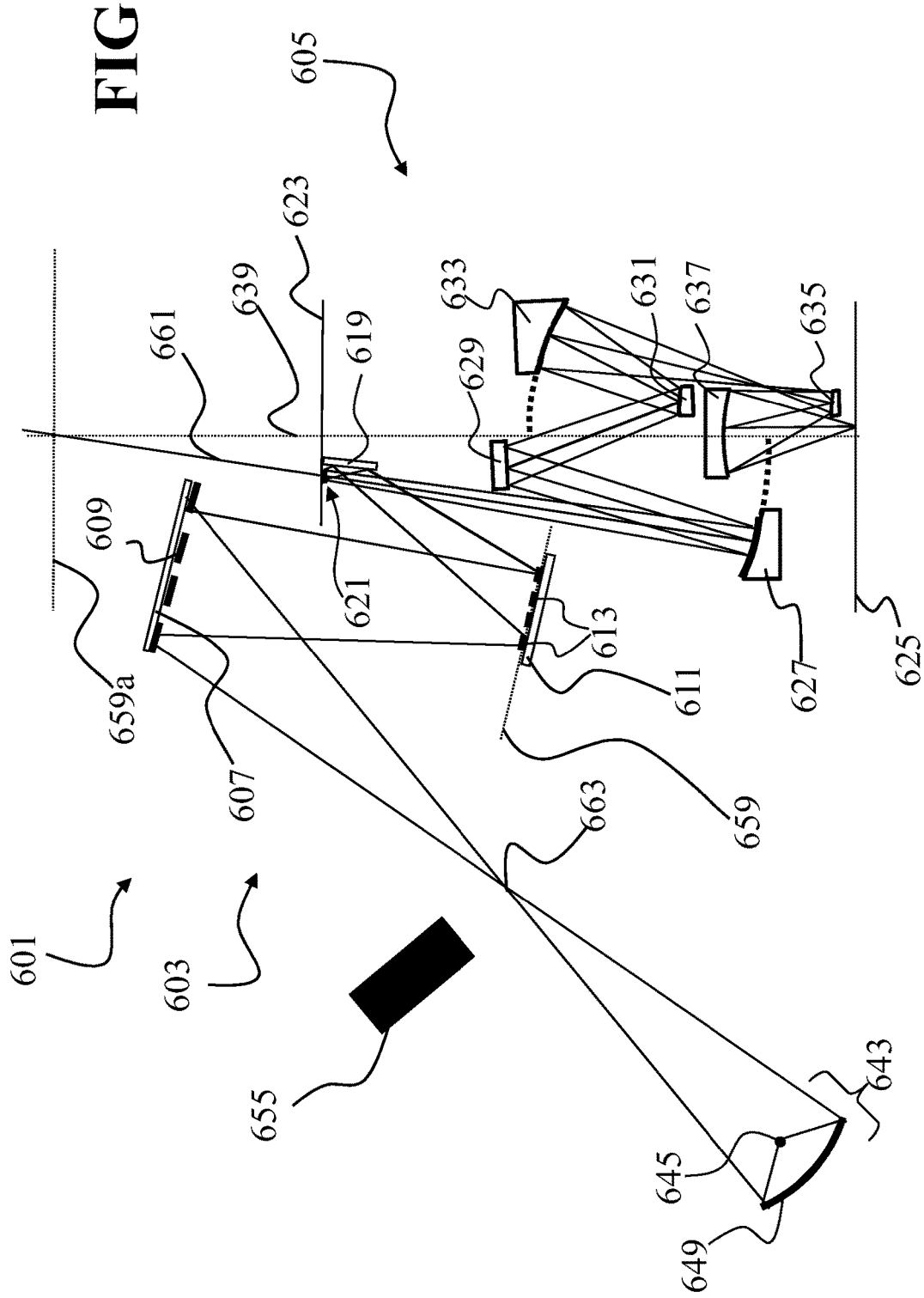
FIG. 6 shows a further embodiment of the EUV microlithography projection exposure apparatus according to the disclosure during operation of the exposure light source.

FIG. 6 shows a further embodiment of the EUV microlithography projection exposure apparatus according to the disclosure. The projection exposure apparatus 601 in this case includes the illumination optics 603 and the projection optics 605. In contrast to the projection optics 5 illustrated in FIG. 1a, the projection optics 605 shown in FIG. 6 have a negative inlet pupil back focus distance. This means that the inlet pupil plane 659 of the projection optics 605 is arranged before the object field 621 in the light path direction. If the chief ray 661 is lengthened further, without adversely affecting the reflection on the structured mask at the point in the object field 621, then the chief ray intersects the optical axis 639 on the plane 659a. If the reflection on the structured mask at the point in the object field 621 and on the deflection mirror 619 is taken into account, then the plane 659a coincides with the inlet pupil plane 659. In the case of projection optics such as these with a negative inlet pupil back focus distance, the chief rays relating to different object field points at the point in the object field 621 have a divergent ray profile in the light direction. Projection optics such as these are known from US2009/0079952A1. A further difference from the illumination optics shown in FIG. 1a is that the source plasma 645 is first of all imaged at an intermediate focus 663 via the collector mirror 649. This intermediate focus 663 is then imaged on the second reflective facet elements 613 of the second optical element 611 via the first reflective facet element 609 of the first faceted optical element 607.

Figure 7:
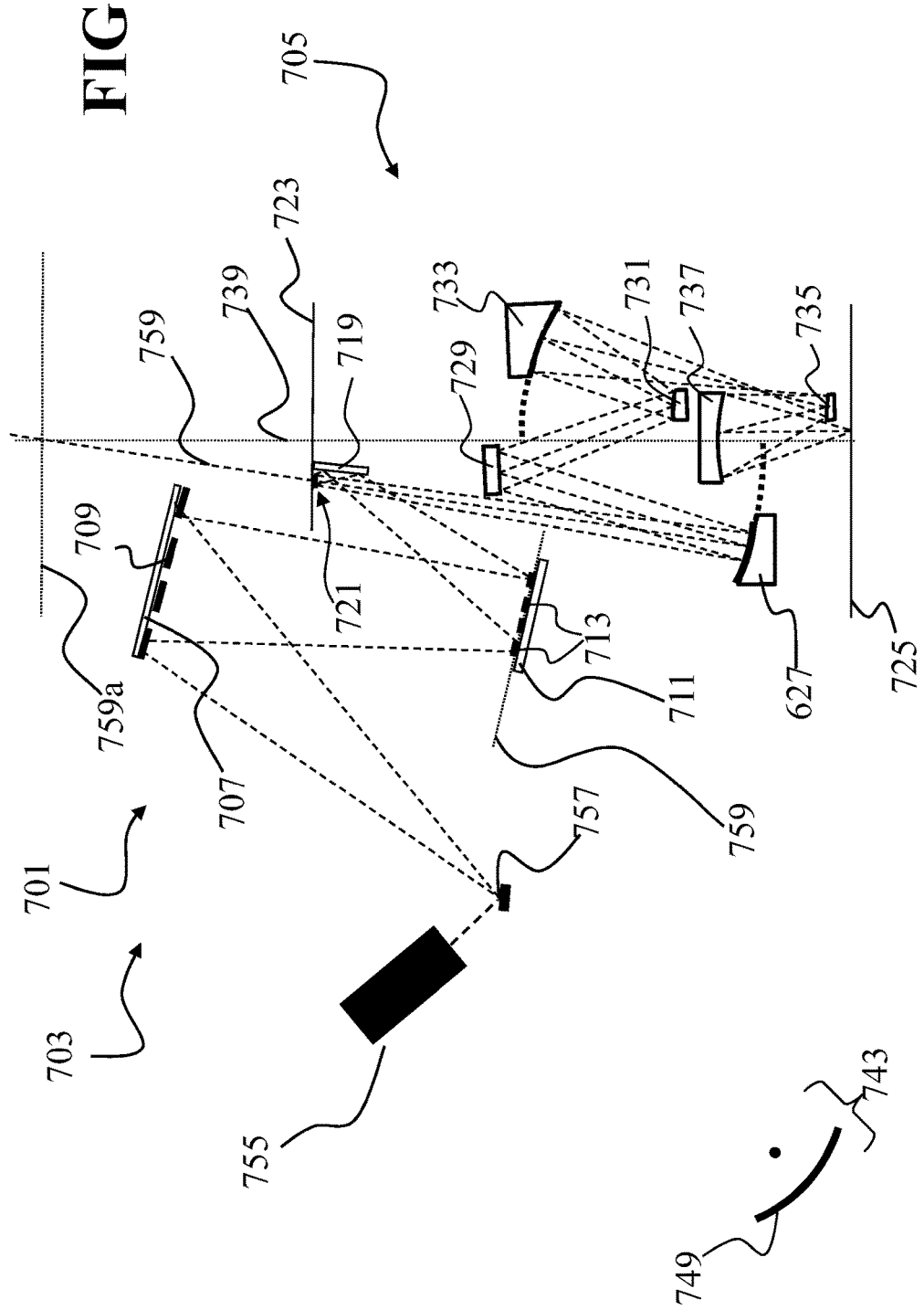
FIG. 7 shows a further embodiment of the EUV microlithography projection exposure apparatus according to the disclosure during operation of the heat light source.

FIG. 7 shows how the heat light source 755 is input in this embodiment of the projection exposure apparatus, in that the input element 757 is introduced and is positioned at the point of the intermediate focus 663. The input element is once again in the form of a reflective optical element with diffractive structures, in the form that the first faceted optical element 707 has a second associated intensity distribution applied to it, which differs from the first associated intensity distribution essentially by a position-independent factor, which is applied to the first faceted optical element 707 during operation of the exposure light source. In this refinement as well the wavelength of the heat light source 755 and the coatings on the mirrors 707, 711, 719, 727, 729, 731, 733, 735, 737 are chosen such that the mean reflectivity of the mirrors for radiation in the second spectral range, that is to say in the range from 1 µm to 50 µm, differs from the mean reflectivity of the mirrors in the first spectral range, that is to say in the range from 5 nm to 15 nm, by no more than 5% points during operation of the heat light source. This results in the mirror which is arranged downstream from the first reflective faceted optical element 707 in the beam path also having a second associated intensity distribution in the second spectral range applied to it, which differs from the first intensity distribution associated with the respective mirror essentially by a position-independent factor.

Figure 8A:
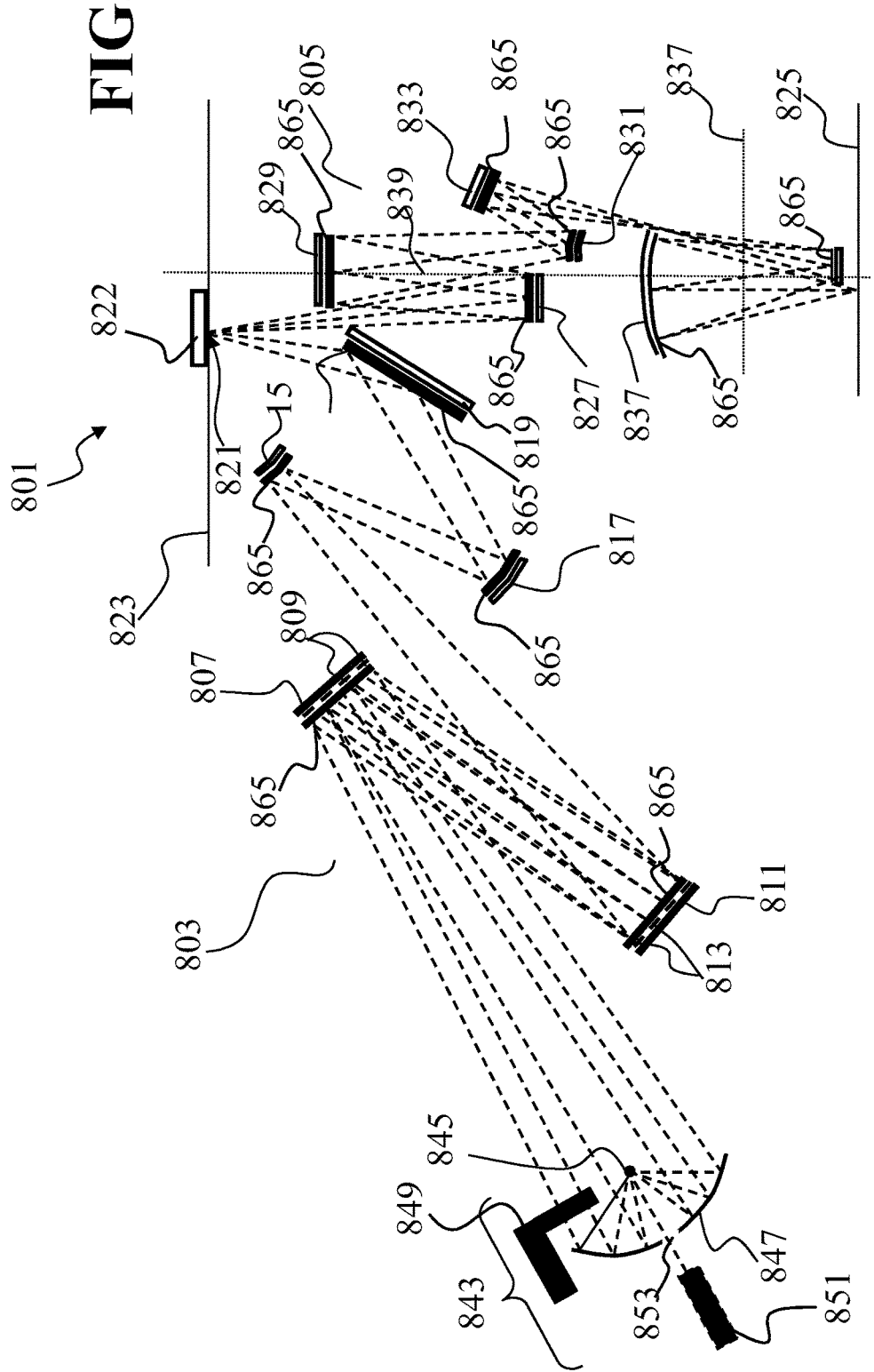
FIG. 8a shows a further embodiment of the EUV microlithography projection exposure apparatus according to the disclosure, which includes an exposure light source with a laser which is used as a heat light source at the same time.

FIG. 8a shows a further refinement of the EUV microlithography projection exposure apparatus according to the disclosure. In this refinement, the exposure light source 843 includes a $CO_2$ laser 851 at a wavelength of 10.6 µm, which is the heat light source at the same. During operation of the exposure light source, the droplet generator 849 produces material droplets and moves them to the point of the source plasma 845, using the laser radiation from the laser 851 to change them to a plasma state, the exposure light source 843 has a further operating mode, in which the laser 841 acts as a heat light source. However, it should be noted that filter elements are typically located in the beam path during operation of an exposure light source such as this, in order to filter out the residual components of the laser radiation in the second spectral range. Before the laser is operated as a heat light source, these filter elements should be removed from the beam path. By way of example, the laser can be operated as a heat light source by setting it to a longer pulse duration. If the laser 851 has a longer pulse duration, the material droplet will already have been changed to its plasma state at the start of the laser pulse, as a result of which the remaining part of the laser pulse is reflected back from the source plasma 845 in the direction of the collector mirror 847. In addition to the radiation in the first spectral range from 5 nm to 15 nm, this results in a high component of radiation in the second spectral range (10.6 µm), both of which are directed at the collector mirror 847 and have similar angular distributions. However, since the mirrors have a reflectivity of more than 95% for radiation at the wavelength 10.6 µm (see FIG. 4), only a small proportion of the radiation in the second spectral range is normally absorbed by the mirrors. In order to compensate for this, the mirrors are each provided with an infrared absorber 865. These are suitably shaped elements composed of a heat-resistant glass or ceran, or some other ceramic. These elements are arranged in front of the mirrors to be heated. These materials have high absorption for radiation at the wavelength 10.6 µm, as a result of which they are heated quickly, and emit the heat to the mirrors arranged adjacent to them. Furthermore, these materials have low thermal conductivity, as a result of which the temperature distribution on the infrared absorbers corresponds to the intensity distribution of the incident radiation in the region of 10.6 µm. The adjacent mirrors are in this case heated by thermal radiation in the range from 0.5 µm to 3 µm, emitted from the infrared absorbers. However, the absorption of the infrared absorbers is so high that only a small amount of radiation in the region of 10.6 µm is reflected in the direction of the respectively next mirror in the light path. In order to compensate for this, reflector points 867 are arranged in the surface of the infrared absorber, illustrated in detail in FIG.

8b. The left-hand area of FIG. 8b shows a view of an infrared absorber 865 with reflector points 867, and the right-hand area shows a section through the infrared absorber along the dashed line shown on the left. By way of example, the reflector points are regions on the surface of the infrared absorber with a metallic coating. These regions therefore have high reflectivity for radiation in the region of 10.6 µm. The mean reflectivity of the infrared absorber for radiation at the wavelength 10.6 µm is therefore set by the density distribution of the reflector points 867 on the infrared absorber 865. If the reflector points have a reflectivity of approximately 100% and the infrared absorber has a reflectivity of approximately 0%, then the mean reflectivity corresponds essentially to the ratio of the area of the reflector points 867 to the area of the infrared absorber 865 located underneath.

What is claimed is:

1. An apparatus, comprising:
   an exposure light source configured to produce radiation in a first spectral range from 5 nm to 15 nm;
   a heat light source configured to produce radiation in a second spectral range from 1 µm to 50 µm; and
   an optical system comprising a first group of mirrors configured to guide radiation from the first spectral range along a first light path so that each mirror in the first group of mirrors has a first associated intensity distribution applied to it in the first spectral range during operation of the exposure light source,
   wherein:
      the heat light source is configured so that at least one mirror in the first group of mirrors has a second associated intensity distribution in the second spectral range applied to it during operation of the heat light source;
      the first intensity distribution differs from the second intensity distribution essentially by a position-independent factor;
      a mean reflectivity of the at least one mirror for radiation in the second spectral range differs from a mean reflectivity of the at least one mirror for radiation in the first spectral range by no more than 5%; and
      the apparatus is an EUV-microlithography projection exposure apparatus.

2. The apparatus of claim 1, further comprising an input element configured to: receive radiation from the heat light source; and pass the received radiation from the heat light source to the at least one mirror in the first group.

3. The apparatus of claim 2, wherein the input element comprises a diffractive optical element configured to produce the second intensity distribution on the at least one mirror.

4. The apparatus of claim 1, further comprising a second group of mirrors which is a subset of the first group of mirrors, wherein:
   the second group of mirrors comprises the at least one mirror;
   the heat light source and the input element are configured so that the radiation from the heat light source is guided along a second light path via all the mirrors in the second group of mirrors; and
   the second light path is contained completely in the first light path.

5. The apparatus of claim 4, wherein:
   each mirror in the second group has a second associated intensity distribution in the second spectral range applied to it during operation of the heat light source; and
   for each mirror in the second group of mirrors, the first associated intensity distribution differs from the second associated intensity distribution essentially by a factor which is specific for the mirror.

6. The apparatus of claim 5, wherein, for each mirror in the second group of mirrors, the specific factor of the mirror differs from the specific factor of a different mirror in the second group of mirrors by no more than 10%.

7. The apparatus of claim 1, wherein the exposure light source comprises a laser configured to produce a plasma, and the laser is also the heat light source.

8. The apparatus of claim 7, further comprising an input element configured to:
   receive radiation from the heat light source; and guide the radiation received from the heat light source to the at least one mirror in the first group,
   wherein:
      the exposure light source comprises material droplets configured to be excited to a plasma state by the radiation of the laser during operation of the exposure light source; and
      the material droplets are configured to reflect radiation from the laser so that the material droplets are configured to be used as an input element during operation of the laser as a heat light source.

9. A method, comprising:
   providing the apparatus according to claim 1;
   irradiating the at least one mirror with radiation from the second spectral range to preheat the at least one mirror over a time period, thereby producing a first temperature distribution on the at least one mirror; and
   using the optical system to expose a photosensitive substrate with radiation from the first spectral range.

10. The method of claim 9, wherein, during the preheating of the at least one mirror, an infrared absorber is fitted in front of the at least one mirror to increase the absorption of the radiation from the second spectral range.

11. The method of claim 9, wherein the infrared absorber comprises a ceramic.

12. The method of claim 9, wherein the infrared absorber comprise a heat-resistant glass or ceran.

13. The method of claim 9, wherein the first temperature distribution differs from a second temperature distribution, the second temperature distribution being present at the at least one mirror during the exposure step due to absorption of the radiation from the first spectral range.

14. The method of claim 13, wherein the second temperature distribution differs from the first temperature distribution by no more than 1 Kelvin at a point on the at least one mirror.

15. A method, comprising:
   providing the apparatus of claim 1, the exposure light source comprising a laser configured to produce a plasma;
   introducing an input element;
   operating the laser as the heat light source;
   removing the input element; and
   operating the laser as a component of the exposure light source.

16. The apparatus of claim 1, wherein the second intensity distribution is greater than the first intensity distribution.

17. The apparatus of claim 1, wherein the second intensity distribution is more than three times the first intensity distribution.

18. The apparatus of claim 1, wherein the second intensity distribution is more than five times the first intensity distribution.

19. The apparatus of claim 1, wherein the second intensity distribution is more than 10 times the first intensity distribution.

20. An apparatus, comprising:
- a light source configured to: a) produce radiation in a first spectral range from 5 nm to 15 nm; and b) produce radiation in a second spectral range from 1 µm to 50 µm; and
- an optical system comprising a first group of mirrors configured to guide radiation from the first spectral range along a light path so that each mirror in the first group of mirrors has a first associated intensity distribution applied to it in the first spectral range during operation of the light source, wherein:
- the light source is configured so that at least one mirror in the first group of mirrors has a second associated intensity distribution in the second spectral range applied to it during operation of the light source;
- the first intensity distribution differs from the second intensity distribution essentially by a position-independent factor;
- a mean reflectivity of the at least one mirror for radiation in the second spectral range differs from a mean reflectivity of the at least one mirror for radiation in the first spectral range by no more than 5%; and
- the apparatus is an EUV-microlithography projection exposure apparatus.

21. The apparatus of claim 20, wherein the second intensity distribution is greater than the first intensity distribution.

22. The apparatus of claim 20, wherein the second intensity distribution is more than three times the first intensity distribution.

23. The apparatus of claim 20, wherein the second intensity distribution is more than five times the first intensity distribution.

24. The apparatus of claim 20, wherein the second intensity distribution is more than 10 times the first intensity distribution.

* * * * *

UNITED STATES PATENT AND TRADEMARK OFFICE
CERTIFICATE OF CORRECTION

PATENT NO. : 9,588,435 B2
APPLICATION NO. : 13/783533
DATED : March 7, 2017
INVENTOR(S) : Damian Fiolka It is certified that error appears in the above-identified patent and that said Letters Patent is hereby corrected as shown below:

In the Drawings

Sheet 4, Figure 3B, delete "3,5" and insert -- 3.5 --.

Sheet 4, Figure 3B, delete "3,25" and insert -- 3.25 --.

Sheet 4, Figure 3B, delete "2,75" and insert -- 2.75 --.

Sheet 4, Figure 3B, delete "2,5" and insert -- 2.5 --.

Sheet 5, Figure 4, delete "Wafelength" and insert -- Wavelength --.

Sheet 5, Figure 4 (second occurrence), delete "Wafelength" and insert -- Wavelength --.

In the Specification

Column 2, Line 2, delete "recticle" and insert -- reticle --.

Column 3, Lines 13-15, should read -- $\min_{(x,y)\in A}\left(\dfrac{I1(x,y)}{I2(x,y)}\right) \geq 0.9 \cdot \dfrac{\int_A \dfrac{I1(x,y)}{I2(x,y)} dxdy}{\int_A dxdy}$ --.

Column 6, Line 60, delete "(LPP)." and insert -- (LPS). --.

Signed and Sealed this
Twenty-first Day of August, 2018

Andrei Iancu
*Director of the United States Patent and Trademark Office*